United States Patent [19]

Truchsess

[11] Patent Number: 5,061,905
[45] Date of Patent: Oct. 29, 1991

[54] ELECTRONIC CIRCUIT FOR PRODUCING AN IRREGULAR PULSE TRAIN OF VARIABLE FREQUENCY AND DUTY CYCLE

[76] Inventor: Joseph Truchsess, 11 Windward La, City Island, N.Y. 10464

[21] Appl. No.: 614,730

[22] Filed: Nov. 16, 1990

[51] Int. Cl.[5] .................. H03K 3/36; A63H 33/26
[52] U.S. Cl. .................................. 331/47; 331/78; 331/111; 331/143; 331/185; 340/384 E; 446/409
[58] Field of Search .............. 331/46, 47, 56, 78, 331/111, 143, 185; 340/384 E; 446/397, 409

[56] References Cited

U.S. PATENT DOCUMENTS 4,219,962 9/1980 Dankman et al. .................. 446/409

Primary Examiner—Siegfried H. Grimm
Attorney, Agent, or Firm—Schechter, Brucker & Pavane

[57] ABSTRACT

An inexpensive yet effective circuit for producing an irregular pulse train of variable frequency and duty cycle, particularly for generating simulated sounds, such as engine sounds for toy vehicles, is disclosed. The circuit comprises an integrated circuit including a plurality of Schmitt trigger inverters (U1A, U1B) configured for oscillation at different frequencies, and a resistance element (R3, R7) in series with one, and preferably both, of the power supply connections to the inverters, with the circuit output comprising the output of one of the Schmitt trigger inverters (U1B). In a preferred embodiment, a capacitance element (C4) is connected between the output of a Schmitt trigger inverter and its system voltage input for further modulating the circuit output.

19 Claims, 2 Drawing Sheets

SIMPLIFIED WAVEFORMS (VBI=6V)

ELECTRONIC CIRCUIT FOR PRODUCING AN IRREGULAR PULSE TRAIN OF VARIABLE FREQUENCY AND DUTY CYCLE

BACKGROUND OF THE INVENTION

1. Field of the Invention

The present invention relates to electronic circuits for generating audio-frequency signals suitable for amplification and play through a loudspeaker, and whose characteristics can be tailored to provide a reasonable simulation of car or truck engine sounds, as we 1 as other sounds, for use primarily in toys and games.

2. Prior Art

A variety of methods have been used to generate vehicle engine sounds for use in toys, games and other such devices. The earliest of these were mechanical or electromechanical devices which spun toothed wheels against "flappers", either by means of an electric motor or by the "human power" of a child pushing the toy. However, these systems suffered from a lack of realism, large size, and mechanical complexity.

More recently, electronic devices have been incorporated into products to produce engine sounds. In some cases, actual sampled, digitized recordings of engine sounds have been used, played back either by a microcomputer, as in Nylint Corp.'s Sound Machine TM, or by a specialized integrated circuit sound playback device, as in the case of the Sounds of Power TM product from Road Champs. These techniques provide good realism but at relatively high cost.

Other electronic simulations have been achieved by less expensive microcomputer algorithmic sound synthesis techniques which, however, provide less realism. Still lower cost, but with concomitantly less realism, have been achieved with simple circuits employing oscillators. The lack of realism results from the regularity and predictability at the output of the oscillator.

SUMMARY OF THE INVENTION

It is accordingly an object of this invention to provide a means of generating simulated engine sounds for toy vehicles.

It is also an object of the invention to provide such a sound generating means for generating realistic sounds at low cost.

It is a further object of the invention to provide such a sound generating means whose overall frequency can be readily varied to produce simulated "acceleration" and "deceleration".

It is a further object of the invention to provide such a sound generating means whereby the aforementioned simulated "acceleration" and "deceleration" may be achieved by simply closing and opening a switch contact.

It is a further object of the invention to provide such a sound generating means which is capable of generating other sounds (e.g. simulated insect sounds) in which a degree of irregularity and unpredictability is desirable.

It is a further object of the invention to provide a sound generating means as above-described and which may be fabricated from commonly available parts at very low manufacturing cost, and which is highly commercial.

Broadly speaking, the circuit of the invention for generating an irregular, variable frequency pulse train comprises at least first and second Schmitt trigger inverters configured for oscillation at different frequencies; a power supply having system and ground voltage outputs connected to each of said Schmitt trigger inverters for powering same; and a resistance element in series with at least one of the system voltage output or the ground voltage output for varying same with oscillation of the Schmitt trigger inverters, whereby the outputs of the Schmitt trigger inverters cross-modulate each other, with the irregular, variable frequency pulse train comprising the output of one of the Schmitt trigger inverters.

In a preferred circuit, the Schmitt trigger inverters comprise an integrated circuit, and a resistance element is in series with each of the system voltage output and the ground voltage output. In the preferred circuit, the irregular pulse train is generated at the output of the second Schmitt trigger inverter, and a capacitance element is connected between the output of the first Schmitt trigger inverter and either the system voltage output or the ground voltage output for further modulating the pulse train. In a typical application, the pulse train output from the second Schmitt trigger inverter is amplified and played through a speaker. In applications where vehicle engine sounds are simulated, acceleration and deceleration can be simulated upon activation and deactivation of the circuit by time delaying application of the power supply's system voltage output to the integrated circuit, as by employing an RC circuit.

These as well as other objects and advantages of the present invention will be more fully apparent from the following detailed description and appended drawing of the presently preferred embodiments thereof.

DETAILED DESCRIPTION OF THE PREFERRED EMBODIMENT

Figure 1:
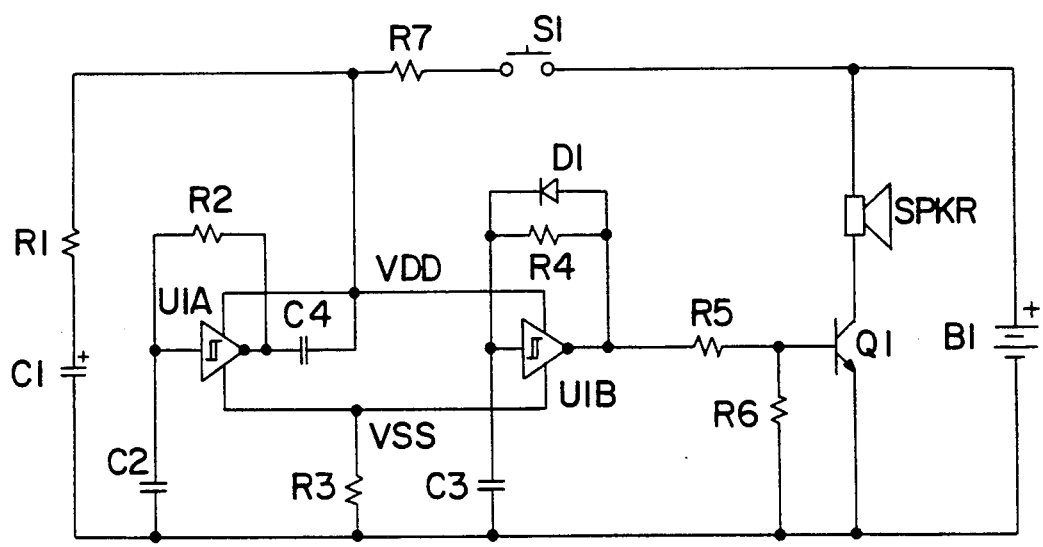
FIG. 1 is a schematic diagram of the circuit of the preferred embodiment of the invention.

With reference to the schematic diagram shown in FIG. 1, the preferred embodiment of the invention comprises a multiple-Schmitt-trigger-inverter integrated circuit U1 configured to generate, with its peripheral circuit components, an irregular pulse train. The preferred embodiment of the invention also includes transistor Q1, which amplifies the output pulse train from U1, loudspeaker SPKR for converting the amplified pulse train to audible sound, and battery B1 for powering the system.

A component list for the circuit of FIG. 1 is as follows:

| Component Values | |
|---|---|
| R1 - 560 ohms | U1 - MM74C14 |
| R2 - 330K | D1 - 1N4148 |
| R3 - 4K7 | Q1 - 9014C or equivalent |
| R4 - 150K | S1 - SPST momentary switch |
| R5 - 4K7 | SPKR - 64 ohm dynamic speaker |
| R6 - 22K | B1 - 3 V-9 V Battery |
| R7 - 4K7 | |
| C1 - 220 uF | |
| C2 - 47 nF | |
| C3 - 47 nF | |
| C4 - 220 nF | |

Operation

Schmitt trigger inverters U1A and U1B, in a manner well known in the art, are configured as relaxation oscillators by connecting resistors R2 and R4 between their respective outputs and inputs and capacitors C2 and C3 between their respective inputs and system ground. In FIG. 1, R2 and R4 are different such that U1 and U2 oscillate at different frequencies. As is also well known in the art, the addition of diode D1 in U1B's feedback loop provides a shorter discharge path in one direction than the other for C3, resulting in an asymmetrical pulse output from U1B.

It is known that the frequency of such relaxation oscillators is a function of the magnitude of the supply voltage (Vdd minus Vss) applied to the inverter circuit (the voltage difference between pins 14 and 7 in the preferred MM74C14 integrated circuit U1). The oscillators' frequencies, therefore, can be varied by varying the voltages on the Vdd and Vss pins of U1. As shown in FIG. 1, by inserting resistors R7 and R3 in series with these pins, voltage variations are impressed upon Vdd and Vss, thereby frequency modulating the oscillators. In this regard, while it is common practice to configure Schmitt trigger inverters as relaxation oscillators, it is highly unorthodox to deliberately insert resistance into the power supply connections as herein; indeed, steps are usually taken to insure minimal resistance in the power supply connections.

By way of further explanation, frequency modulation of oscillators U1A and U1B results from the inclusion of R7 and R3 because the current drawn by U1A and U1B varies during oscillation. In the absence of R7 and R3, these current variations would not cause any variation in the voltage drop across U1A or U1B. However, inclusion of the resistors R7 and R3 effectively converts variations in current drawn by U1A and U1B into voltage changes at Vdd and Vss, respectively.

Yet additional frequency modulation of the oscillators U1A and U1B is effected by inclusion of C4 between Vdd and the output of U1A. Inclusion of capacitor C4 impresses a square wave on Vdd. This, of course, causes further variations in the voltage Vdd and, therefore, further frequency modulation of the output from U1A itself, and also the output from U1B, which is also powered by Vdd.

Of course, it is the output from U1B which drives the speaker SPKR through Q1. As noted, however, U1A and U1B oscillate at different frequencies because R2 and R4 are different. Consequently, U1A has a different modulating effect on Vdd and Vss then does U1B. Therefore, U1A has some cross-modulating effect on the output from U1B through its effect on Vdd and Vss irrespective of the inclusion of C4. Likewise, U1B's modulation effect on Vdd and Vss through R3 and R7 has some cross-modulation effect on U1A's output which, through C4, further modulates U1B's output.

From the foregoing, it will be apparent that inclusion of either resistor R7 or R3 will have some frequency modulation effect on the output from U1A and U1B though, in the preferred circuit, both R7 and R3 are included. The foregoing is true irrespective of the inclusion of C4, though C4 is preferred as it injects an additional substantial frequency modulation component to U1A and U1B. Of course, a similar effect could be accomplished by imposing the square wave output from U1A through C4 to Vss since, as noted, variation of either or both of Vdd and Vss frequency modulates the oscillator's output.

The overall frequency and perceived pitch of the circuit's output i.e., the output of U1B, can be increased or decreased by 10 increasing or decreasing, respectively, the voltage applied at Vdd by battery B1. In FIG. 1, this is achieved by R7 and C1 which, together, form a lag circuit with a time constant of about 0.5 seconds, such that when momentary switch S1 is closed and held, the voltage Vdd increases relatively slowly, imparting a vehicle "acceleration" noise effect. In a similar fashion, opening S1 results in a vehicle "deceleration" noise as C1 discharges into the circuit. Resistor R1 provides a slight "step" in Vdd when the switch S1 is first opened or closed, which has been found to enhance the subjective realism of the simulated engine sound at the output of U1B as heard through speaker SPKR. In a practical application, the switch S1 would correspond, for example, to the accelerator pedal in a toy vehicle.

Due to the self-modulation of the frequency output of U1A and U1B by R3 and R7, and the cross-modulation of U1B by the output of U1A through C4, the resultant pulse train at U1B's output exhibits complex and somewhat unpredictable variations in its instantaneous frequency and duty cycle. The characteristics of these variations also change as Vdd is increased or decreased, with the result that as the simulated engine is "accelerated" or "decelerated" by closing and opening, respectively, S1, the pulse width, frequency, and variations thereof change in a manner which reasonably simulates acceleration and deceleration of a vehicle engine.

Figure 2:
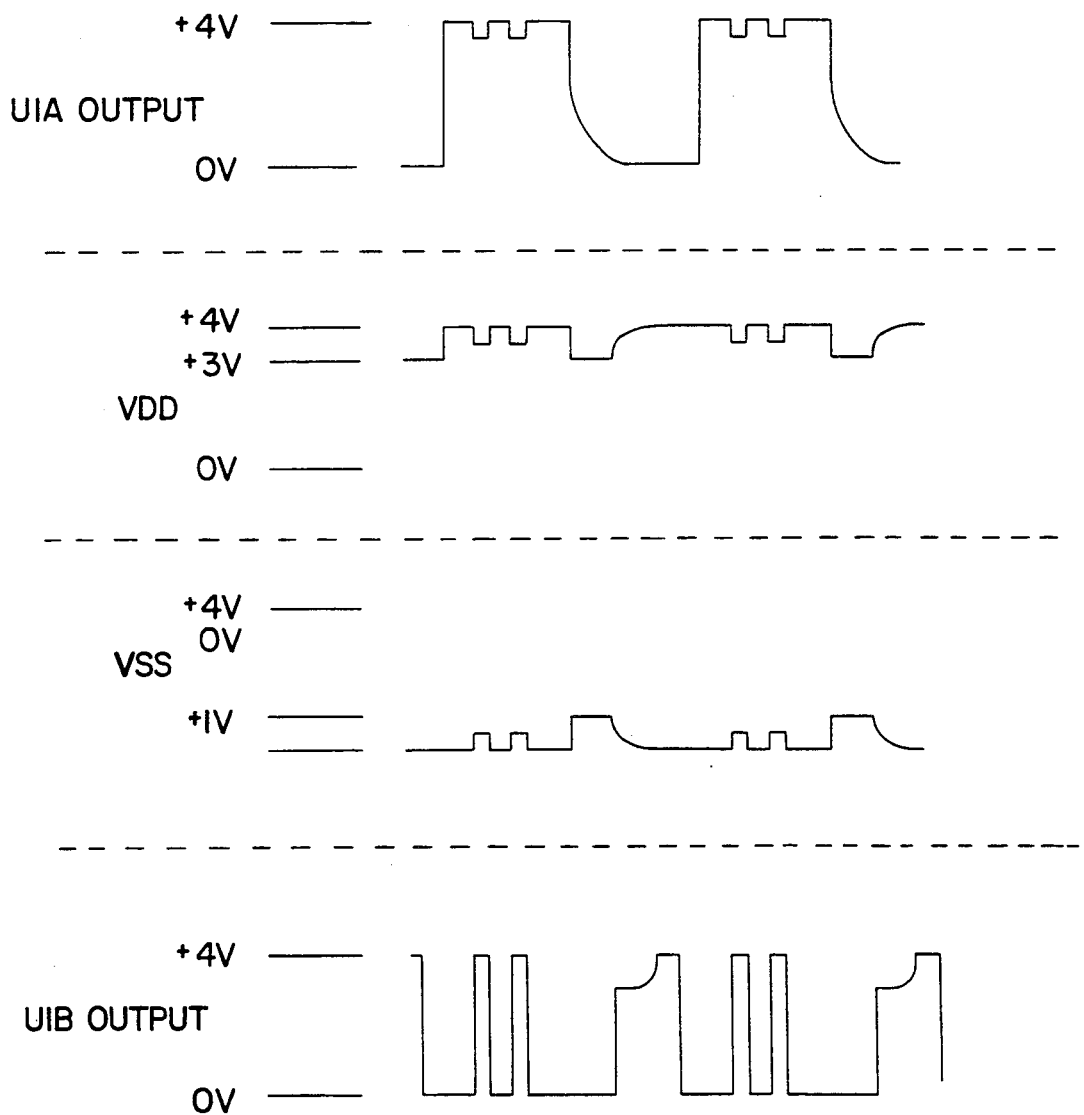
FIG. 2 is a graph showing typical waveforms at various points in the circuit of FIG. 1, the waveforms being somewhat simplified for ease of illustration.

Typical waveforms at various points in the circuit of FIG. 1 are shown in FIG. 2, wherein the irregular pulse train output from U1B is the lowermost waveform. It should be recognized that the waveforms in FIG. 2 comprise a "snapshot" at one point in time, and that these waveforms may vary significantly at other times, such as during the acceleration and deceleration cycles.

It should be noted that the choice of component values and relative frequencies of the oscillators are of great importance in determining the resultant sound's characteristics. By judicious selection of these parameters, an engine sound can be produced which is low-pitched and accelerates slowly, like a large truck, or which is high-pitched and has rapid acceleration, as in a race car or motorcycle. Likewise, many other interesting sounds can be produced by the circuit, such as chirping insect sounds and "space noises", by simply varying component values.

From the foregoing, it will be apparent that the circuit of the invention provides a simple, cost-effective means of generating simulated engine sounds and other irregular sounds for use in toys, games, or similar products. Indeed, as compared with previous schemes for generating such sounds, the invention provides a great deal of sound variation at a very low cost.

While I have herein shown and described one preferred embodiment of the invention, and have suggested certain changes and modifications thereto, it will be apparent to those of ordinary skill in the art who have read this description that still further changes and modifications may be made therein without departing from the spirit and scope of the invention. For example, while two Schmitt-trigger-inverter circuits are shown in FIG. 1, additional inverters may be configured as oscillators to add further spectral components and complexity to the output waveform input to Q1. For example, the preferred integrated circuit chip for U1 includes the potential for six such inverter circuits. The outputs from such additional inverters could be coupled, as through capacitors, to Vdd, Vss, both, or neither. In this regard, due to the above-mentioned voltage drop effect of resistors R3 and R7, each inverter will have some frequency modulating effect on the other inverters in the circuit even if its output is not connected to Vdd or Vss. Still another possibility is reversing diode D1, which would have the effect of inverting the pulse train at U1B's output, or adding an additional resistor in series with D1, which would limit and control U1B's basic pulse width. As these as well as additional changes and variations may be made in the invention without departing from the spirit and scope thereof, the above description should be construed as illustrative, and not in a limiting sense, the scope of the invention being defined by the following claims.

I claim:

1. A circuit for generating an irregular, variable frequency pulse train comprising:
    at least first and second Schmitt trigger inverters configured for oscillation at different frequencies;
    a power supply having system and ground voltage outputs connected across each of said Schmitt trigger inverters for powering same; and
    a resistance element in series with at least one of said system voltage output or said ground voltage output for varying same with oscillation of said Schmitt trigger inverters, whereby the outputs of said Schmitt trigger inverters cross-modulate each other, with said irregular, variable frequency pulse train comprising the output of one of said Schmitt trigger inverters.

2. The circuit of claim 1, wherein said Schmitt trigger inverters comprise an integrated circuit.

3. The circuit of claim 2, wherein said resistance element is in series with said system voltage output and a second resistance element is in series with said ground voltage output.

4. The circuit of claim 2, wherein said one Schmitt trigger inverter is said second Schmitt trigger inverter, and further comprising a capacitance element connected between the output of said first or second Schmitt trigger inverter and one of said system voltage output and said ground voltage output.

5. The circuit of claim 4, wherein said capacitance element is connected to the output of said second Schmitt trigger inverter.

6. The circuit of claim 3, wherein said one Schmitt trigger inverter is said second Schmitt trigger inverter, and further comprising a capacitance element connected between the output of said first or second Schmitt trigger inverter and one of said system voltage output and said ground voltage output.

7. The circuit of claim 6, wherein said capacitance element is connected to the output of said second Schmitt trigger inverter.

8. The circuit of claim 4, wherein said resistance element is in series with said system voltage output, and further comprising a second capacitance element connected between the system voltage connection to said Schmitt trigger inverters and the ground voltage output from said power supply whereby said resistance element and said second capacitance element define an RC circuit for time delayed application of said system voltage to said integrated circuit thereby further modulating the outputs from said Schmitt trigger inverters.

9. The circuit of claim 6, further comprising a second capacitance element connected between the system voltage connection to said Schmitt trigger inverters and the ground voltage output from said power supply whereby said resistance element and said second capacitance element define an RC circuit for time delayed application of said system voltage to said integrated circuit thereby further modulating the outputs from said Schmitt trigger inverters.

10. The circuit of claim 8, further comprising an additional resistance element in series with said second capacitance element.

11. The circuit of claim 9, further comprising an additional resistance element in series with said second capacitance element.

12. The circuit of claim 11, further comprising means for amplifying the output from said one of said Schmitt trigger inverters, speaker means for converting said output from said one Schmitt trigger inverter to sound, and switch means for selectively connecting said power supply to said integrated circuit.

13. The circuit of claim 4, further comprising means for amplifying the output from said one of said Schmitt trigger inverters, speaker means for converting said output from said one Schmitt trigger inverter to sound, and switch means for selectively connecting said power supply to said integrated circuit.

14. The circuit of claim 9, further comprising additional Schmitt trigger inverters configured for oscillation at yet additional frequencies, with said system and ground voltage outputs from said power supply being connected across each of said additional Schmitt trigger inverters for powering same, thereby further modulating the output from said one Schmitt trigger inverter.

15. The circuit of claim 4, further comprising additional Schmitt trigger inverters configured for oscillation at yet additional frequencies, with said system and ground voltage outputs from said power supply being connected across each of said additional Schmitt trigger inverters for powering same, thereby further modulating the output from said one Schmitt trigger inverter.

16. The circuit of claim 9, further comprising a diode connected between the input and output of said first or second Schmitt trigger inverters.

17. The circuit of claim 16, wherein said diode is connected between the inputs and outputs of said one Schmitt trigger inverter.

18. The circuit of claim 4, further comprising a diode connected between the input and output of said first or second Schmitt trigger inverters.

19. The circuit of claim 18, wherein said diode is connected between the inputs and outputs of said one Schmitt trigger inverter.

* * * * *